United States Patent [19]

Keeling et al.

[11] 4,131,755
[45] Dec. 26, 1978

[54] INTERCONNECTION FOR PHOTOVOLTAIC DEVICE ARRAY

[75] Inventors: Michael C. Keeling, Tempe; William L. Bailey, Scottsdale; Michael G. Coleman, Tempe; Israel A. Lesk, Scottsdale; Robert A. Pryor, Phoenix, all of Ariz.

[73] Assignee: Motorola, Inc., Schaumburg, Ill.

[21] Appl. No.: 807,462

[22] Filed: Jun. 17, 1977

[51] Int. Cl.² ............................................. H01L 31/04
[52] U.S. Cl. .................................................. 136/89 P
[58] Field of Search ........................ 136/89 P, 89 CC

[56] References Cited

U.S. PATENT DOCUMENTS

| 3,713,893 | 1/1973 | Shirland | 136/89 |
| 4,019,924 | 4/1977 | Kurth | 136/89 P |
| 4,045,245 | 8/1977 | Coleman | 136/89 C |

Primary Examiner—John H. Mack
Assistant Examiner—William Leader
Attorney, Agent, or Firm—John A. Fisher

[57] ABSTRACT

An interconnection system for interconnecting a plurality of photovoltaic devices. The photovoltaic devices each have a first and a second side and the interconnect system is located on the second side of the photovoltaic devices. A sheet of dielectric material and a sheet of electrically conductive material are bonded together and positioned so that the dielectric material is next to the photovoltaic devices. A plurality of patterns are formed in the sheet of electrically conductive material. The patterns each have angled tabs punched therein so that the angled tabs are punched through both the electrically conductive material and the dielectric material. When a photovoltaic device is positioned within a group of angled tabs, the angled tabs can be brought into contact with electrical contacts on the first side of the photovoltaic device. The group of angled tabs are electrically common to a part of the pattern which has an extended portion which extends beneath an adjacent photovoltaic device. Some of the dielectric material is removed from the extended portion so that this portion then makes contact with the second side of an adjacent photovoltaic device. The patterns can be formed in predetermined configurations to provide series or series-parallel interconnections for photovoltaic devices within an array of photovoltaic devices. The interconnect system, in turn, provides for substantially all possible series, parallel, or series-parallel interconnections of a plurality of arrays.

9 Claims, 7 Drawing Figures

4,131,755

INTERCONNECTION FOR PHOTOVOLTAIC DEVICE ARRAY

CROSS REFERENCE TO RELATED APPLICATION

A related application is Ser. No. 646,733, filed Jan. 5, 1976, now abandoned of Michael G. Coleman and Robert A. Pryor, and assigned to the assignee of the present invention.

BACKGROUND OF THE INVENTION

This invention relates, in general, to interconnection systems for electrically interconnecting a plurality of devices. More particularly, the invention relates to an interconnection system for interconnecting individual photovoltaic devices in an array.

Photovoltaic devices for converting radiant into electric energy are well known. The most common photovoltaic device is the semiconductor PN junction solar cell. Generally speaking, a single photovoltaic device does not provide sufficient electric voltage or current to be useful in most applications. However, by interconnecting a plurality of photovoltaic devices in series the voltage generated is higher than that generated by a single photovoltaic device. Similarly, connecting a plurality of photovoltaic devices in parallel increases the overall generated electric current; and, of course, the individual photovoltaic devices can be connected in a parallel-series configuration to generate a higher electrical voltage and current than does a single cell.

In the past, the most generally used interconnection scheme for interconnecting a plurality of photovoltaic devices was to use individual conductors which were bonded from one cell to the next. Elaborate fixtures were required to hold the photovoltaic devices in proper relationship with each other and the individual connectors. These fixtures were also necessary to reduce breakage during the bonding of the conductors. In addition, different fixtures were required for different configurations of the assembly. For instance, the same fixture could not be used for a series or a parallel interconnection of photovoltaic devices as was used for a series-parallel interconnection of devices. As a result, the cost of manufacturing equipment was increased and the time consumed in handling each individual conductor added to the cost of manufacture.

Accordingly, it is an object of the present invention to provide an improved interconnection system for a photovoltaic device array.

Another object of the present invention is to provide solder joint stress relief by use of a flexible interconnecting conductor.

Yet another object of the present invention is to provide an interconnection system for photovoltaic devices which requires a single manufacturing tooling fixture for total package interconnection.

A further object of the present invention is to provide an interconnection assembly which avoids handling individual conductors for interconnecting one photovoltaic device to other photovoltaic devices.

Yet a further object of the present invention is to provide an interconnection system of enhanced inherent reliability and performance and which provides an unlimited number of parallel-series combinations of array interconnections.

SUMMARY OF THE INVENTION

In carrying out the above and other objects of the invention in one form there is provided an improved photovoltaic device array having a plurality of photovoltaic devices. The array is assembled by use of an improved interconnect system having a sheet of dielectric material and at least one sheet of electrically conductive material. The two sheets are bonded together to form a laminate. The sheet of electrically conductive material has patterns etched or otherwise formed in it. The patterns have tabs punched therein which are punched through both the electrically conductive material and the dielectric material. One end of each of the tabs is joined to the laminate. The patterns have an extended portion which extends away from the tabs. An area of the dielectric material, over the extended portions, is removed thereby exposing some of the electrically conductive material. Photovoltaic devices are placed on the laminate on the dielectric material side. A group of the punched tabs makes electrical contact with the top side of one of the photovoltaic devices while the exposed electrically conductive material makes contact with the bottom side of an adjacent photovoltaic device. The patterns can be arranged in a manner to provide series, parallel, or series-parallel interconnection of the photovoltaic devices in the array.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner the scope of the invention.

DESCRIPTION OF THE PREFERRED EMBODIMENTS

Figure 1:
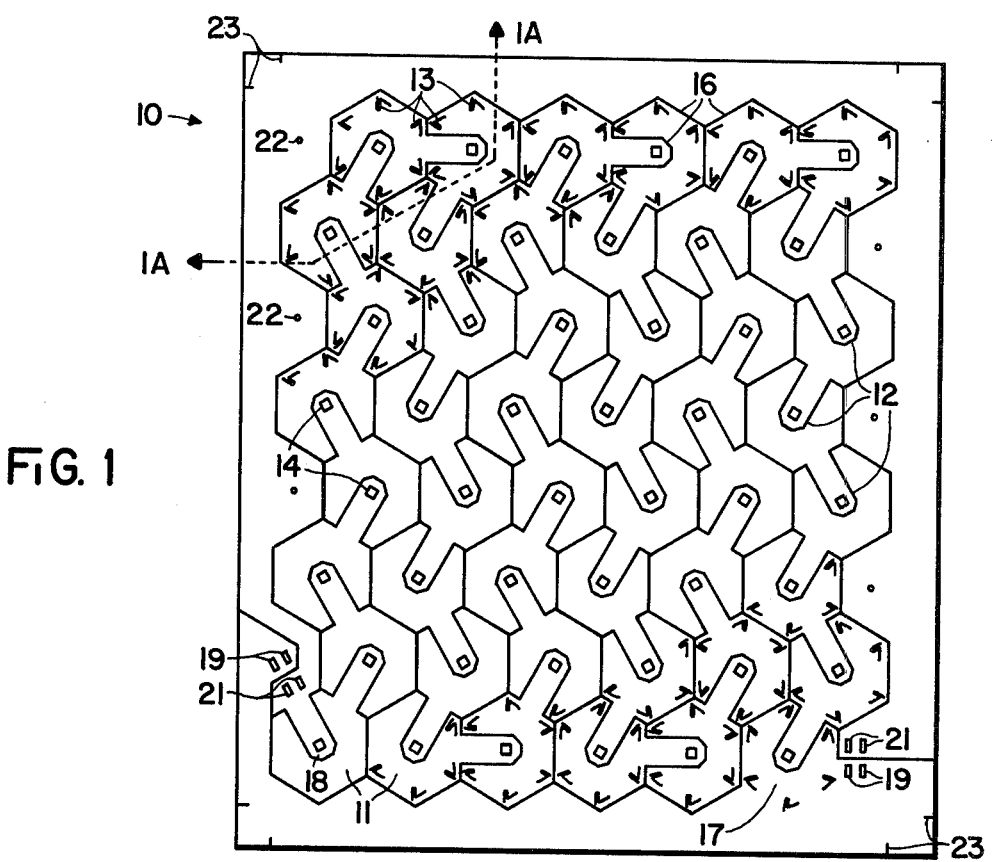
FIG. 1 illustrates an interconnection system employing the invention in one form thereof.

Referring first to FIG. 1, a plan view of an interconnecting system for circular photovoltaic devices is shown. The interconnection system 10 has a first or top sheet of dielectric material bonded to a sheet of electrically conductive material which is visible through the transparent dielectric material. The sheets of dielectric material and electrically conductive material form a laminate which is better shown in FIG. 3. The electrically conductive material can be of any material suitable for conducting electric current, such as copper, aluminum, etc. A plurality of patterns 11 are etched or otherwise formed in the electrically conductive material of FIG. 1 and each pattern 11 has an extended portion 12 which extends towards the central area of an adjacent pattern 11. The particular pattern configuration illustrated for interconnection system 10 will accommodate 48 circular photovoltaic devices. A plurality of angled tabs 13 are punched through the sheets forming the laminate. Tabs 13 form a pattern outlining the periphery of the photovoltaic devices that will be used with interconnection system 10. Some of the dielectric material is removed from the extended portion 12 thereby exposing an area 14 of electrically conductive material. All the lines 16 are preferably formed by etching and indicate a void of electrically conductive material.

As will be seen hereinafter, tabs 13 will be used to make electrical contact with the current carrying conductors of a photovoltaic device while the exposed area 14 of electrically conductive material in the extended portion 12 will make contact with the bottom of an adjacent photovoltaic device. It is preferred that the tabs 13 have an acute angle to provide for strain relief for cyclic stresses which can be thermally induced once the interconnection system is in an operational array and for mechanical stresses which can be induced during manufacture. A group 17 of tabs 13 are shown in the lower right hand corner of interconnect system 10. Although group 17 of angled tabs 13, does not have an extended portion 12, it is in electrical contact with electrical feedthroughs 19. Electrical feedthroughs 19 are electrically common with the connection for the topside of the photovoltaic device positioned in group or pattern 17. In the lower left hand corner there is shown an extended portion 18 which is electrically common to electrical feedthroughs 21 thereby providing an electrical feedthrough connection for the bottom sides of the photovoltaic devices. The pattern configuration illustrated in FIG. 1 provides for connecting 48 circular photovoltaic devices in series with each other. By having duplicate electrical feedthroughs 19 and 21 on each side of interconnection system 10 greater versatility in interfacing with interconnection system 10 is provided. Of course, it will be recognized that electrical feedthroughs can be positioned in other appropriate locations to accommodate yet other interface connections such as series, parallel, or series-parallel. Both sides of interconnecting system 10 have tooling alignment holes 22. The electrically conductive material surrounding the array of patterns 11 extends further than the array area in order to provide current carrying capabilities for the electrical feedthrough locations 19 and 21 from one side of the array to the other side. This excess material is intended to be folded under the array pattern area along fold lines determined by markers 23 so that when the interconnecting system 10 is assembled in a photovoltaic device array solar module border area is minimized. This additional current carrying capability eliminates the requirement of having to add external wires from one side of the array to the other.

Figure 1A:
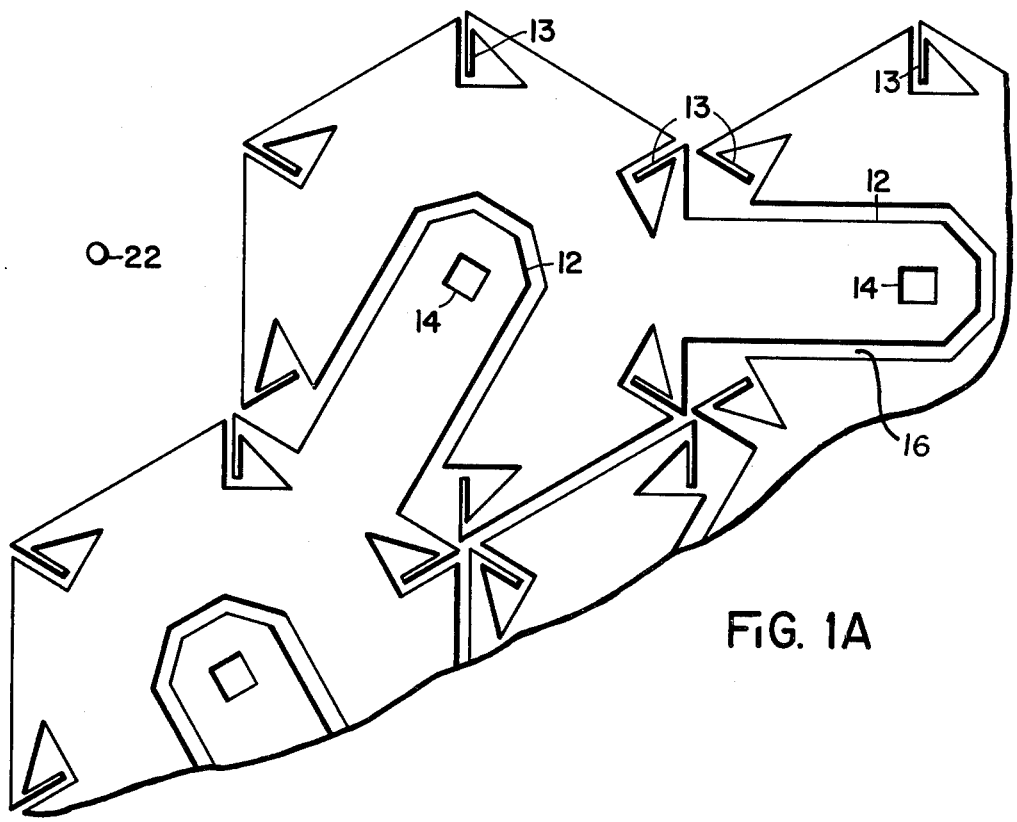
FIG. 1A is an enlarged view of a portion of the interconnection system of FIG. 1 and designated by the lines 1A—1A.

FIG. 1A illustrates in an enlarged view a portion of interconnect system 10 of FIG. 1. The acute angle of angled tabs 13 is better seen. Also, the electrical isolation between patterns, illustrated as lines 16 in FIG. 1, is better illustrated.

Figure 2:
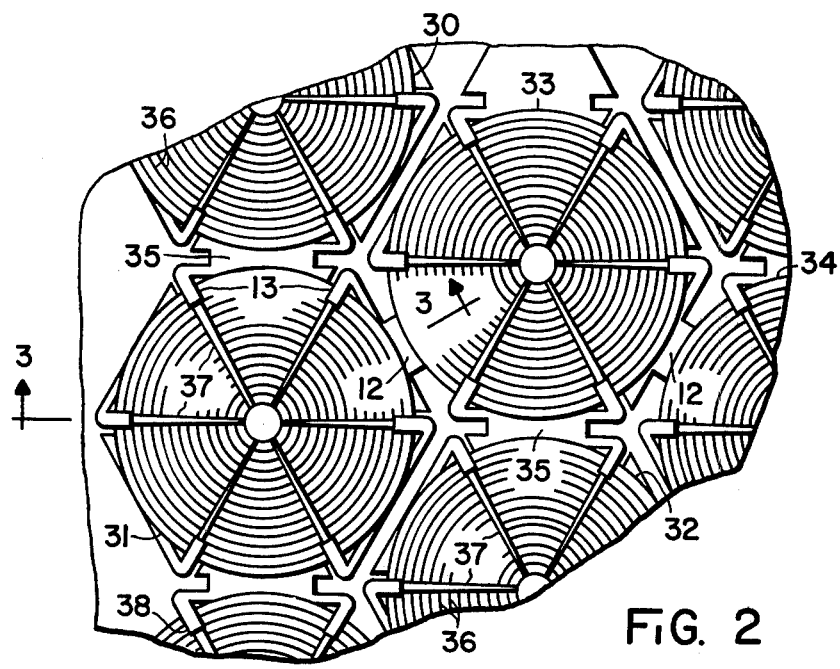
FIG. 2 is a plan view of a segment of a photovoltaic device array employing an interconnection system of the present invention.

A series-parallel interconnection of photovoltaic devices using an embodiment of the present invention is illustrated in FIG. 2. A segment of a photovoltaic device array is illustrated wherein photovoltaic devices 31 and 33 are shown in their entirety with photovoltaic devices 30, 32, and 34 shown in part. The photovoltaic devices have a plurality of electrical conductors arranged in concentric circles 36. These electrical conductors serve as current collectors for the current generated by radiant energy impinging upon the photovoltaic device. Current collectors 36 are interconnected by conductors 37 which terminate at the periphery of the photovoltaic devices to form a contact 38 with angled tabs 13. Thus, current collected by current collectors 36 is conveyed from the photovoltaic device by conductors 37. Current collectors 36 and conductors 37 are deposited onto the photovoltaic devices. Each photovoltaic device interfaces with the interconnection system by way of six tabs 13. This provides for redundant connections to the photovoltaic device and increases the reliability of the array since the failure of one contact 38 will not significantly degrade the operation of the photovoltaic device array.

Photovoltaic devices 30 and 31 are connected in parallel with each other by way of connection 35 which connects the tabs 13 from device 30 to tabs 13 of device 31 thereby providing a common connection between the top sides of devices 30 and 31. Photovoltaic devices 32 and 33 are also connected in parallel in a similar manner. Device 31 is connected in series with device 33 which is also in series with device 34. This series connection is provided by extended portion 12 between photovoltaic device 31 and 33 and between device 33 and 34. Similarly, other devices in parallel with device 31 are in combination connected in series with other devices which are connected in parallel with device 33.

Figure 3:
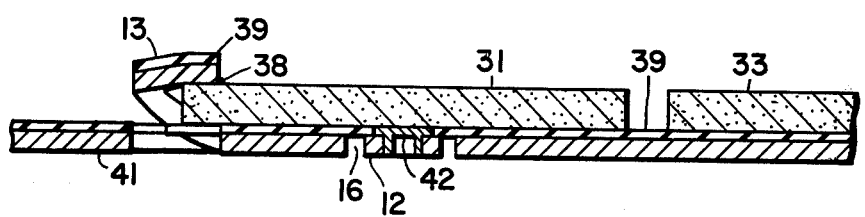
FIG. 3 is a sectional view of a portion of the array illustrated in FIG. 2.
Figure 4:
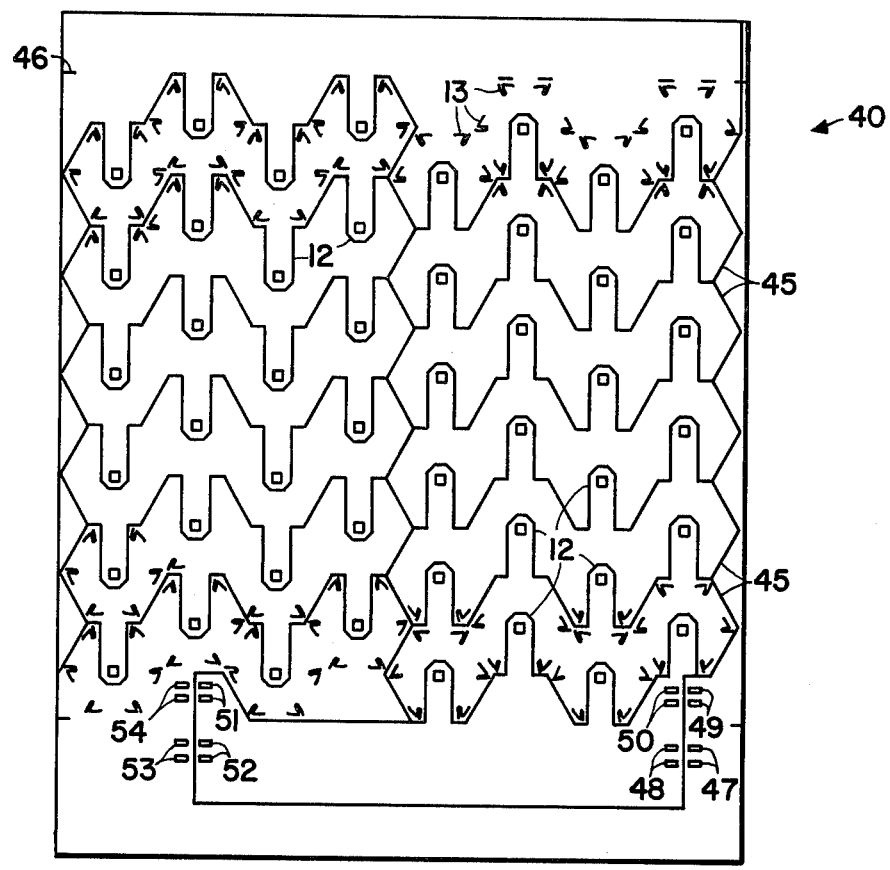
FIG. 4 is a plan view of an interconnection system illustrating another embodiment of the invention.

FIG. 3 is a cross-sectional view of a portion of a segment of FIG. 2 taken along the lines 3—3. This view better illustrates the laminate used in the interconnection system. The laminate is comprised of dielectric layer 39 and an electrically conductive layer 41. Angled tab 13 is shown attached to the top side of photovoltaic device 31 at contact 38. The bottom side of cell 31 is attached to electrically conductive sheet 41 by contact 42. Contact 42 can be any suitable electrically bonding material such as solder. An opening is made in dielectric material 39 to expose electrically conductive material 41 so that contact 42 may be achieved. It will be noted that in FIG. 3 contact 42 extends through electrically conductive material 41. It is not necessary for an opening to exist in material 41 to allow contact 42 to extend therethrough, however, the opening serves as an inspection hole to verify that soldered or bonded contact 42 was properly made. It will be noted that angled tab 13 is electrically in common with a portion of electrically conductive material 41 located underneath photovoltaic device 31 and is punched through both layers of the laminate. The loose end of angled tab 13 is on the dielectric side of the laminate. The photovoltaic device must be positioned so that its electrical conductors are beneath angled tabs 13. The angled tabs are then pressed down onto the electrical conductors and soldered. Tabs 13 help to maintain the photovoltaic devices spaced apart until the soldering is complete. The portion of material 41 containing contact 42 is electrically isolated from angled tab 13 by way of a void of material shown at 16 which is illustrated in FIG. 1 as line 16 and can better be seen in FIG. 1A. The isolated portion of material 41 containing contact 42 is an extended portion 12 of an adjacent pattern which is electrically common to angled tabs 13 connected to the top side of an adjacent photovoltaic device as illustrated in FIGS. 1 and 4. Dielectric material 39 can be any suitable material that is flexible and capable of withstanding the soldering temperature and which will keep leakage currents down in the order of microamps. Polyimide is a suitable dielectric material and can be purchased from Dupont under their trade name "KAPTON".

A series-parallel interconnection system 40 is illustrated in FIG. 4. This interconnection system 40 provides for connecting circular photovoltaic devices in parallel in groups of four and then serially connecting the groups with 11 other groups to provide four parallel by twelve series photovoltaic device to photovoltaic device connections. Patterns 45 each contain groups of tabs 13 arranged so that each group will receive one photovoltaic device. All the groups of tabs 13 within one pattern 45 are electrically common thereby providing for interconnecting the top sides of four photovoltaic devices. These photovoltaic devices are connected to the bottom side of adjacent photovoltaic devices by four extended portions 12. It again should be noted that each extended portion 12 has an opening in the dielectric material to expose the electrically conductive material beneath the dielectric. Eight electrical feedthroughs 47 through 54 provide means for interfacing electrically to the photovoltaic device array. Interconnect system 40 as illustrated in FIG. 4 will be folded along fold lines located by markers 46 prior to installation in a solar module. The fold will cause electrical feedthrough holes 47 and 48 to mate respectively with holes 49 and 50 while holes 52 and 53 will mate respectively with holes 51 and 54. Electrical feedthroughs 48, 50, 51, and 52 are all electrically common while feedthroughs 47, 49, 53, and 54 are electrically in common.

Figure 5:
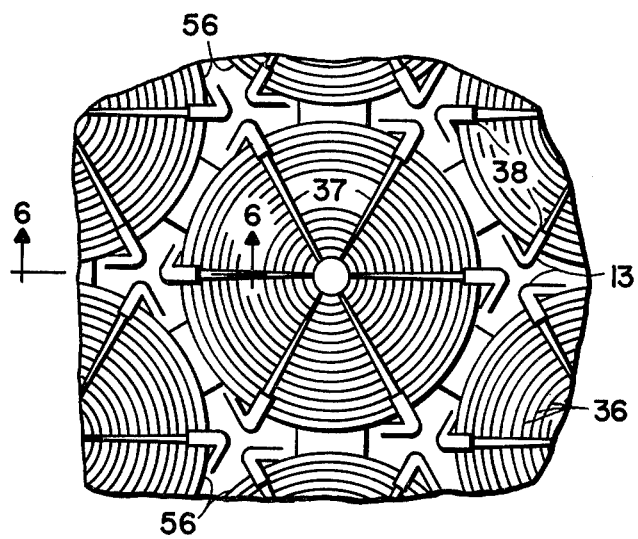
FIG. 5 is a plan view of a segment of a photovoltaic device array employing yet another embodiment of the invention.

In FIG. 5 there is illustrated a segment of a photovoltaic device array having a plurality of photovoltaic devices 56 which are all connected in parallel. Each photovoltaic device 56 has current collectors 36 arranged in concentric circles which are interconnected by conductors 37 which also provide an interface contact point 38 for each individual photovoltaic device. Photovoltaic devices 56 each have six tabs 13 making contact with the top side of the photovoltaic device. The interconnect system used for interconnecting photovoltaic devices 56 has a laminate comprising a sheet of dielectric material sandwiched between two sheets of electrically conductive material. This configuration is better illustrated in FIG. 6.

Figure 6:
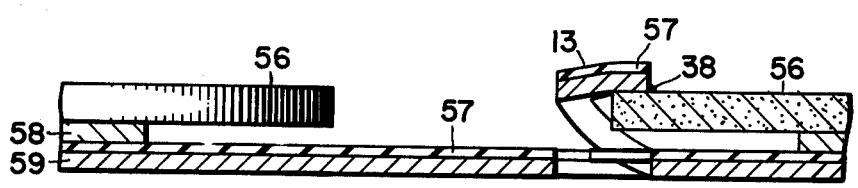
FIG. 6 is a sectional view of a portion of the array illustrated in FIG. 5.

A cross-sectional view of a portion of the segment illustrated in FIG. 5 is taken along lines 6—6 and illustrated in FIG. 6. A sheet of electrically conductive material 58 cooperates with a similar sheet 59 to sandwich dielectric material 57 therebetween. Electrically conductive material 58 is used for making electrical connections with the bottom portions of photovoltaic devices 56. Angled tabs 13 are punched from the laminate formed by materials 57, 58, and 59 and are raised upward and brought into contact with the topside of photovoltaic device 56 after device 56 is in position and tabs 13 are pressed down. Electrically conductive material 58 as illustrated in FIG. 6 has voids near and surrounding tabs 13 to avoid electrical shorts occurring between the material 59 and 58.

By now it should be appreciated that there has been provided a novel and improved interconnection system, for interconnecting a plurality of photovoltaic devices, which greatly reduces manufacturing costs associated with producing a solar module. The present invention takes the assembly operations from the individual photovoltaic device level to the total package level. The present invention is not only a practical approach but is accomplished with low-cost materials, minimum tooling, and yet includes the ability to reclaim the materials lost in the etching process particularly where copper is used as the electrically conductive material. More importantly, the present invention offers an inherently greater reliability due to the ease with which redundant contacts can be added and the strain relief provided by the angled tabs at essentially no extra cost.

The method of assembling a solar module employing the present invention includes etching or forming the desired patterns into the electrically conductive material of the laminate and then punching tabs from the laminate. The angled tabs remain attached at one end to the electrically conductive material with the loose ends being raised up so that photovoltaic devices can be accommodated in a skeleton outline formed by the tabs. When the tabs are pressed down they make contact with the top side of the photovoltaic device. It is preferred to etch the material prior to punching the tabs since the laminate will be more rigid and can therefore be easier held and supported prior to the punching. Once a laminate has been punched, the photovoltaic devices can be placed over the dielectric materials in conjunction with a group of tabs. Preferably the tabs and the contact areas for the bottom sides of the photovoltaic devices are solder tinned or a suitable base matal deposited prior to the placing of the photovoltaic devices on the laminate. Once the photovoltaic devices are in place all the individual device connections in the package can be made in one operation by oven solder reflowing. When the photovoltaic devices are in position the tabs assist in maintaining the devices in position. Solder joint stress relief is provided by the use of the acute angled tabs as well as flexible dielectric material and the electrically conductive material which is also flexible. This increases the reliability of the solar array module since thermal cycling fatigue is greatly reduced.

The use of the interconnect system with the photovoltaic devices as shown provides for a closely packed array that has a minimum of interstitial areas. The relatively wide metal conductors which skirt the perimeter of the patterns eliminates the need for additional wires and their connection points within a solar module array. In the past, many of the photovoltaic devices used were square or rectangular in configuration. However, such devices resulted in wasted silicon material. Typically, the silicon from which the semiconductor photovoltaic devices are made is grown in a circular rod configuration and then sliced to provide silicon wafers. If a square wafer is then made from the circular wafer it is apparent that considerable waste of silicon material results. The present invention permits the use of circular devices in closely packed arrays, thereby conserving silicon material and approaching the packing density permitted with square or rectangular photovoltaic devices. However, it should be recognized that the present invention can be used with any shape of photovoltaic device simply by punching the angled tabs in the proper configuration within each pattern. In addition, the patterns can be arranged so that they appear to be in elongated patterns arranged in an interdigitated or comb manner wherein one elongated pattern will make contact with one side of a plurality of photovoltaic devices while an adjacent elongated pattern will make contact with an opposite side of a plurality of photovoltaic devices.

While the present invention has been described with reference to particular preferred forms thereof in accordance with the Patent Statutes, it is to be understood that modifications may be made by those skilled in the art without actually departing from the invention. Therefore, it is intended in the appended claims to cover all such equivalent variations as come within the spirit and scope of the invention.

What is claimed as new and desired to secure by Letters Patent of the United States is:

1. A photovoltaic solar module for converting radiant energy to electric current and having an interconnection sheet comprising: a plurality of photovoltaic devices arranged in an array, the photovoltaic devices each having a first and a second side, the first side having contacts for providing current of a first polarity and the second side having at least one contact for providing current of a second polarity; a sheet of dielectric material positioned adjacent to and in contact with the second sides of the plurality of photovoltaic devices, the sheet of dielectric material having a plurality of voids therein; a sheet of electrically conductive material bonded to the sheet of dielectric material, the sheet of electrically conductive material having a plurality of patterns etched therein and a plurality of tabs punched from the patterns, the tabs shaped to have an acute angle in the plane of the patterns and having one end attached to the pattern, the acute angled tabs protruding through the sheet of dielectric material so that a portion of the acute angled tabs can make contact with the contacts on the first side of the photovoltaic device and each pattern of the sheet of electrically conductive material making contact with the second side of one of the photovoltaic devices through one of the plurality of voids in the sheet of dielectric material.

2. The photovoltaic solar module of claim 1 wherein the sheet of electrically conductive material has voids aligned with and smaller than the voids in the sheet of dielectric material so that when the contact of the photovoltaic cell is bonded to the sheet of electrically conductive material an inspection of the bond can be made.

3. The photovoltaic solar module of claim 1 wherein the sheet of electrically conductive material is copper.

4. The photovoltaic solar module of claim 2 wherein the photovoltaic cell is soldered to the sheet of electrically conductive material.

5. The photovoltaic solar module of claim 1 wherein individual patterns of the plurality of patterns are etched in a manner to be electrically isolated from other patterns.

6. A photovoltaic solar module for converting radiant energy to electrical energy including an interconnection system for interconnecting a plurality of photovoltaic devices, the photovoltaic devices having a first and a second side, comprising: dielectric means positioned in contact relationship with the second side of the plurality of photovoltaic devices and having openings located beneath each of the plurality of photovoltaic devices; electrically conductive means positioned in contact relationship with the dielectric means, the electrically conductive means being comprised of a plurality of patterns, each of the plurality of patterns being associated with a photovoltaic device, each of the plurality of patterns having acute angled tabs shaped in the plane of the electrically conductive means, the acute angled tabs punched and protruding through the dielectric means so that the acute angled tabs can make contact with the first side of the associated photovoltaic device and each of the plurality of patterns being capable of making contact with the second side of a photovoltaic device located adjacent to the associated photovoltaic device, contact being made through one of the openings in the dielectric means.

7. The photovoltaic solar module of claim 6 wherein some of the plurality of patterns are electrically connected to adjacent patterns thereby enabling the photovoltaic devices to be interconnected in series and in parallel and any combinations thereof.

8. An interconnection system for connecting a plurality of photovoltaic devices all in parallel in a photovoltaic solar module, the photovoltaic devices each having a first and a second side, the interconnect system comprising: a first sheet of electrically conductive material; a sheet of dielectric material bonded to one side of the first sheet of electrically conductive material; and a second sheet of electrically conductive material bonded to the sheet of dielectric material so that the sheet of dielectric material is sandwiched between the first and second sheets of electrically conductive material, and portions of the first sheet of electrically conductive material are etched away thereby forming voids, a plurality of angled tabs punched through the sheet of dielectric material and the second sheet of electrically conductive material, the angled tabs being located in the voids of the first sheet of electrically conductive material so that the angled tabs are capable of making contact with the first side of the photovoltaic devices and the first sheet of electrically conductive material making contact with the second side of the photovoltaic devices.

9. An interconnect system for interconnecting an array of photovoltaic devices comprising a sheet of electrical conducting material and a sheet of dielectric material bonded together, the sheet of electrically conducting material having patterns formed therein to provide at least two conductive paths for outputs of the array of photovoltaic devices, and at least one of the two conductive paths having angled tabs punched therein, the angled tabs having an acute angle shape in the plane of the electrical conducting material and providing means for connecting to a top surface of the photovoltaic devices.

* * * * *